(12) United States Patent
Kim et al.

(10) Patent No.: US 9,496,121 B2
(45) Date of Patent: Nov. 15, 2016

(54) ANTENNA UNITS, SUBSTRATE TREATING APPARATUSES INCLUDING THE SAME, AND SUBSTRATE TREATING METHODS USING THE APPARATUSES

(75) Inventors: Hyung Joon Kim, Gyeonggi-do (KR); Hyung Je Woo, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1079 days.

(21) Appl. No.: 13/485,305

(22) Filed: May 31, 2012

(65) Prior Publication Data

US 2012/0305527 A1    Dec. 6, 2012

(30) Foreign Application Priority Data

May 31, 2011  (KR) .................. 10-2011-0052429
Aug. 19, 2011 (KR) .................. 10-2011-0082679

(51) Int. Cl.
*H01L 21/306* (2006.01)
*C23C 16/00* (2006.01)
*H01J 37/32* (2006.01)
*H01Q 7/00* (2006.01)
*H01Q 21/06* (2006.01)

(52) U.S. Cl.
CPC ............. *H01J 37/3211* (2013.01); *H01Q 7/00* (2013.01); *H01Q 21/06* (2013.01)

(58) Field of Classification Search
CPC ................. H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ...... 118/723 I, 723 IR, 723 AN; 156/345.48, 156/345.49; 315/111.51
See application file for complete search history.

(56) References Cited

U.S. PATENT DOCUMENTS 6,229,264 B1 * 5/2001 Ni et al. ................... 315/111.51
2009/0126634 A1   5/2009 Yamazawa
2010/0269980 A1  10/2010 Nishimura et al.

FOREIGN PATENT DOCUMENTS

| CN | 101877312 A | 11/2010 |
|---|---|---|
| JP | 09-055375 | 2/1997 |
| JP | 2010-258324 | 2/1997 |
| JP | 09-228056 | 9/1997 |
| JP | 2001-353440 | 12/2001 |
| JP | 2001-353440 A | 12/2001 |
| JP | 2002-343773 | 11/2002 |

(Continued)

OTHER PUBLICATIONS

Japanese Notice of Allowance for Application No. 2012-125416 dated Apr. 28, 2014.

(Continued)

*Primary Examiner* — Luz Alejandro Mulero
(74) *Attorney, Agent, or Firm* — Jenkins, Wilson, Taylor & Hunt, P.A.

(57) ABSTRACT

Provided is a substrate treating apparatus, which includes a process chamber having an inner space, a substrate support part disposed within the process chamber, and supporting a substrate, a gas supply part supplying a process gas into the process chamber, an antenna configured to supply high frequency power into the process chamber to excite the process gas within the process chamber, and a driving part varying a size of the antenna.

19 Claims, 11 Drawing Sheets

(56) References Cited

FOREIGN PATENT DOCUMENTS

| | | |
|---|---|---|
| JP | 2003-086577 | 3/2003 |
| JP | 2006-253250 | 9/2006 |
| KR | 10-2002-0010472 | 2/2002 |
| KR | 10-0839911 B1 | 6/2008 |
| TW | 463201 | 11/2001 |
| TW | 2006/12489 A | 4/2006 |
| TW | 2008/17532 A | 4/2008 |
| WO | WO 03/017738 | 2/2003 |
| WO | WO 2006/041634 | 4/2006 |
| WO | WO 2007/130489 | 11/2007 |
| WO | WO 2011-102083 | 8/2011 |

OTHER PUBLICATIONS

Chinese Examination Report for Application No. dated Jul. 30, 2014.
Taiwanese Office Action for Application No. 101119463 dated Sep. 26, 2014.

* cited by examiner

ANTENNA UNITS, SUBSTRATE TREATING APPARATUSES INCLUDING THE SAME, AND SUBSTRATE TREATING METHODS USING THE APPARATUSES

CROSS-REFERENCE TO RELATED APPLICATIONS

This U.S. non-provisional patent application claims priority under 35 U.S.C. §119 of Korean Patent Application Nos. 10-2011-0052429, filed on May 31, 2011, and 10-2011-0082679, filed on Aug. 19, 2011, the entire contents of which are hereby incorporated by reference.

BACKGROUND OF THE INVENTION

The present invention disclosed herein relates to an apparatus for treating a substrate, and more particularly, to an apparatus for treating a substrate by using plasma.

Plasma is generated at very high temperature or by strong electric fields or radio frequency (RF) electromagnetic fields, and is denoted as an ionized gas state formed of ions, electrons, or radicals. In semiconductor device fabrication processes, an etching process is performed by using plasma. The etching process is performed by allowing ion particles contained in the plasma to collide with a substrate.

Antennas may apply high frequency power to a process gas to excite the process gas to a plasma state. Typical antennas have a fixed shape, and are bilaterally symmetrical. Theoretically, such an antenna generates plasma having a symmetrical density distribution along the radial direction of the antenna. However, a density distribution of plasma is practically asymmetrical due to various causes. Such an asymmetrical density distribution of plasma may cause an uneven substrate treating process.

Patent Document

Korean Patent Publication No. 10-2011-0046354

SUMMARY OF THE INVENTION

The present invention provides an apparatus and method for uniformly treating a substrate.

Embodiments of the present invention provide substrate treating apparatuses including: a process chamber having an inner space; a substrate support part disposed within the process chamber, and supporting a substrate; a gas supply part supplying a process gas into the process chamber; an antenna configured to supply high frequency power into the process chamber to excite the process gas within the process chamber; and a driving part varying a size of the antenna.

In some embodiments, the antenna may include: a plurality of antenna frames spaced apart from one another; and a plurality of connecting members connecting neighboring ones of the antenna frames to each other, and the driving part may be provided in plurality to be connected to the antenna frames, respectively, and individually move the antenna frames.

In other embodiments, the antenna frames may be arrayed to form a ring shape, and the driving parts may move the antenna frames along a radial direction of the ring shape, respectively.

In still other embodiments, each of the antenna frames may have an arc shape.

In even other embodiments, the connecting members may be stretched or contracted according to movement of the antenna frames.

In yet other embodiments, each of the connecting members may include: a first frame connected to one of the antenna frames; a second frame connected to another antenna frame adjacent to the antenna frame connected to the first frame; and a third frame connecting the first frame and the second frame to each other, and having an arc shape.

In further embodiments, the antenna may include: a first antenna; and a second antenna spaced apart from the first antenna, and surrounding the first antenna, and the driving part may be provided in plurality to individually vary a size of the first antenna and a size of the second antenna.

In still further embodiments, the first antenna may include: a plurality of first antenna frames arrayed to form a first ring shape; and a plurality of first connecting members connecting neighboring ones of the first antenna frames to each other, the second antenna may include: a plurality of second antenna frames arrayed to form a second ring shape having a radius greater than that of the first ring shape; and a plurality of second connecting members connecting neighboring ones of the second antenna frames to each other, and the driving parts may include: a first driving part moving the first antenna frames along a radial direction of the first ring shape; and a plurality of second driving parts individually moving the second antenna frames along a radial direction of the second ring shape.

In even further embodiments, the first driving part may include: a first driving rod disposed at a center of the first antenna, and vertically extending; a plurality of first connecting rods individually connecting the first antenna frames to the first driving rod; and a first driver rotating the first driving rod through a predetermined angle about an axis parallel to a longitudinal direction of the first driving rod.

In yet further embodiments, the second driving parts may include: a plurality of second driving rods connected to the second antenna frames, respectively, and having a longitudinal direction that is the radial direction of the second ring shape; and a plurality of second drivers connected to the second driving rods, respectively, and moving the second driving rods along the radial direction of the second ring shape.

In much further embodiments, the antenna may include: a plurality of antenna frames spaced apart from one another to form a ring shape; and a plurality of connecting members connecting the antenna frames, and the driving part may simultaneously move the antenna frames.

In still much further embodiments, the driving part may include: a driving rod vertically extending at a center of the ring shape; a plurality of connecting rods individually connecting the antenna frames to the driving rod; and a driver rotating the driving rod about an axis parallel to a longitudinal direction of the driving rod.

In other embodiments of the present invention, antenna units for applying high frequency power to a process gas to excite the process gas include: an antenna applying the high frequency power; and a driving part varying a size of the antenna.

In some embodiments, the antenna may include: a plurality of antenna frames spaced apart from one another to form a ring shape; and a plurality of connecting members connecting neighboring ones of the antenna frames to each other, and the driving part may be provided in plurality to individually move the antenna frames along a radial direction of the ring shape.

In other embodiments, the driving part may include: a plurality of driving rods extending along the radial direction of the ring shape, and connected to the antenna frames, respectively; and a plurality of drivers connected to the driving rods, respectively, and moving the driving rods along the radial direction of the ring shape.

In still other embodiments, the antenna may include: a plurality of antenna frames spaced apart from one another to form a ring shape; and a plurality of connecting members connecting the antenna frames, and the driving part may simultaneously move the antenna frames.

In even other embodiments, the driving part may include: a driving rod vertically extending at a center of the ring shape; a plurality of connecting rods individually connecting the antenna frames to the driving rod; and a driver rotating the driving rod about an axis parallel to a longitudinal direction of the driving rod.

In yet other embodiments, the antenna may include: a first antenna including first antenna frames arrayed to form a first ring shape; a plurality of first connecting members connecting neighboring ones of the first antenna frames to each other; a second antenna including second antenna frames arrayed to form a second ring shape; and a plurality of second connecting members connecting neighboring ones of the second antenna frames to each other; wherein the second ring shape has a radius greater than that of the first ring shape, and has the same center as that of the first ring shape, and the driving part is provided in plurality to individually vary a size of the first antenna and a size of the second antenna.

In further embodiments, the driving parts may include: a first driving rod vertically extending at the center of the first ring shape; a plurality of connecting rods individually connecting the first antenna frames to the first driving rod; a first driver rotating the first driving rod about an axis parallel to a longitudinal direction of the first driving rod; a plurality of second driving rods extending along a radial direction of the second ring shape, and connected to the second antenna frames, respectively; and a plurality of second drivers connected to the second driving rods, respectively, and moving the second driving rods along the radial direction of the second ring shape.

In still other embodiments of the present invention, substrate treating methods include: supplying a process gas into a process chamber; supplying high frequency power from an antenna into the process chamber to excite the process gas; and treating a substrate by using the excited process gas, wherein the antenna has a variable size.

In some embodiments, the antenna may have a ring shape with a variable size.

In other embodiments, the antenna may include antenna frames arrayed to form a ring shape, and the size of the antenna may be varied by moving at least one of the antenna frames along a radial direction of the ring shape.

In still other embodiments, the antenna frames may be individually moved.

In even other embodiments, the antenna may include a first antenna and a second antenna surrounding the first antenna, and a size of the first antenna and a size of the second antenna may be individually varied.

In yet other embodiments, the first antenna may include first antenna frames arrayed to form a first ring shape, the second antenna may include second antenna frames arrayed to form a second ring shape having a radius greater than that of the first ring shape, the size of the first antenna may be varied by moving the first antenna frames along a radial direction of the first ring shape, and the size of the second antenna may be varied by moving the second antenna frames along a radial direction of the second ring shape.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, an antenna unit, a substrate treating apparatus, and a substrate treating method according to exemplary embodiments of the present invention will be described in detail with reference to the accompanying drawings. Detailed descriptions related to well-known functions or configurations will be ruled out in order not to unnecessarily obscure subject matters of the present invention.

Figure 1:
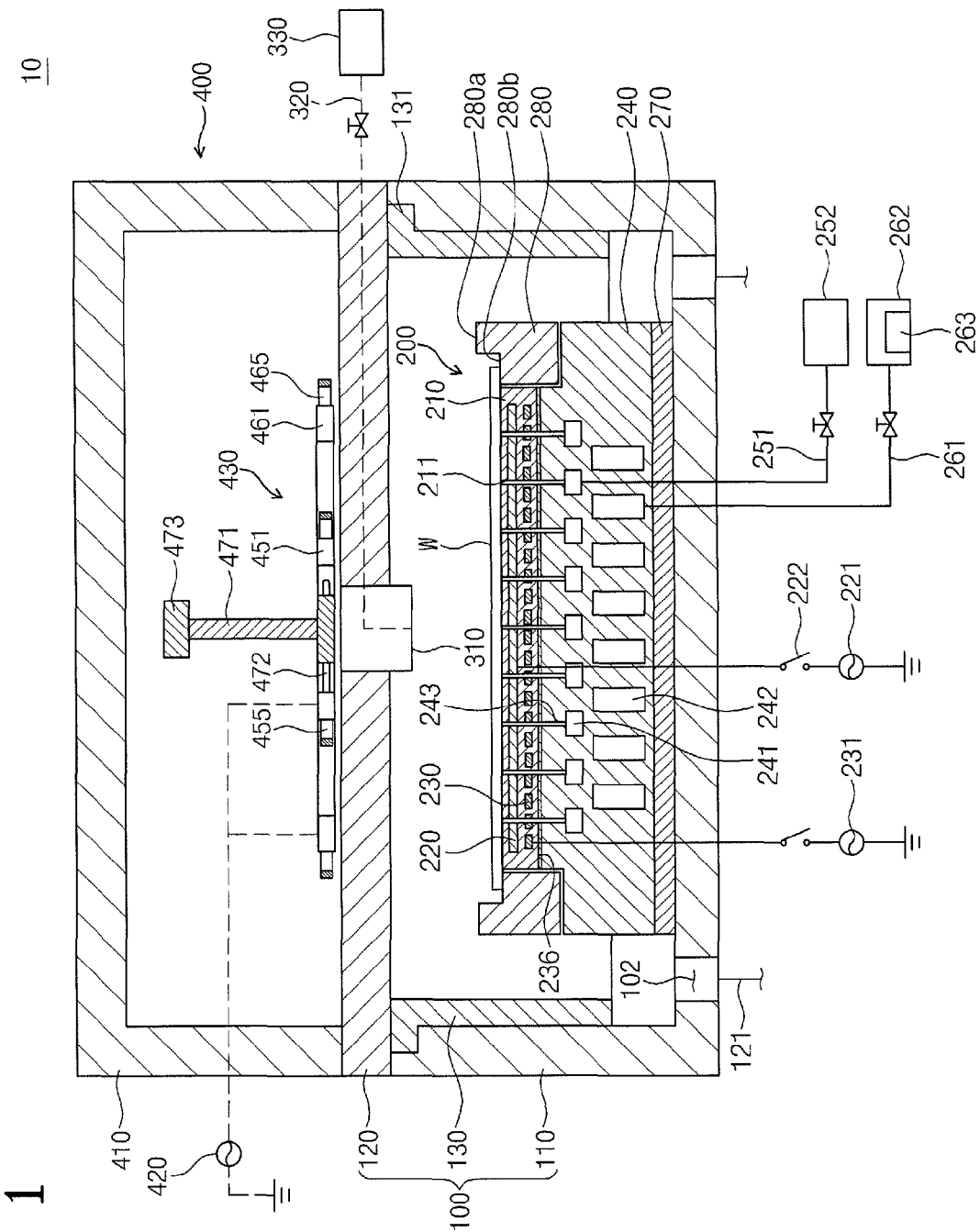
FIG. 1 is a cross-sectional view illustrating an apparatus for treating a substrate according to an embodiment of the present invention.

FIG. 1 is a cross-sectional view illustrating an apparatus for treating a substrate according to an embodiment of the present invention. Referring to FIG. 1, a substrate treating apparatus 10 according to the current embodiment treats a substrate W by using plasma. The substrate treating apparatus 10 includes a process chamber 100, a substrate support part 200, a gas supply part 300, and a plasma generation part 400.

The process chamber 100 provides a space for treating the substrate W. The process chamber 100 includes a body 110, a sealing cover 120, and a liner 130.

The body 110 includes an inner space with an upper opening. The inner space of the body 110 functions as a space for treating the substrate W. The body 110 is formed of a metal. The body 110 may be formed of aluminum. An exhausting hole 102 is disposed in the bottom of the body 110. The exhausting hole 102 is connected to an exhausting line 151. Gas staying within the body 110, and reaction by-products generated during a substrate treating process may be discharged through the exhausting line 151. Accordingly, inner pressure of the body 110 is decreased to a certain level.

The sealing cover 120 covers the upper opening of the body 110. The sealing cover 120 has a plate shape, and seals the inner space of the body 110. The sealing cover 120 may be formed of a material different from that of the body 110. The sealing cover 120 may be formed of a dielectric substance.

The liner 130 is disposed within the body 110. The liner 130 includes an inner space with upper and lower openings. The liner 130 may have a cylindrical shape. The liner 130 may have a radius corresponding to an inner surface of the body 110. The liner 130 extends along the inner surface of the body 110. A support ring 131 is disposed at the upper end of the liner 130. The support ring 131 has a ring plate shape around the liner 130, and protrudes outward therefrom. The support ring 131 is placed on the upper end of the body 110, and supports the liner 130. The liner 130 and the body 110 may be formed of the same material. The liner 130 may be formed of aluminum. The liner 130 protects the inner surface of the body 110. When a process gas is excited, an arc discharge may occur within the process chamber 100. The arc discharge may damage peripheral devices. The liner 130 protects the inner surface of the body 110 from arc discharges. The liner 130 is lower in price than the body 110, and can be easily replaced. Thus, when the liner 130 is damaged by an arc discharge, the liner 130 can be replaced with a new one.

The substrate support part 200 is disposed within the body 110. The substrate support part 200 supports the substrate W. The substrate support part 200 includes an electrostatic chuck holding the substrate W by using an electrostatic force.

The electrostatic chuck (also denoted by 200) includes a dielectric plate 210, a lower electrode 220, a heater 230, a support plate 240, and an insulation plate 270.

The dielectric plate 210 is disposed in the upper end of the electrostatic chuck 200. The dielectric plate 210 is provided in a disc-shaped dielectric substance. The substrate W is placed on the top surface of the dielectric plate 210. The top surface of the dielectric plate 210 has a radius smaller than that of the substrate W. As a result, the edge of the substrate W is positioned outside the dielectric plate 210. First supply channels 211 are formed in the dielectric plate 210. The first supply channels 211 extend from the top surface of the dielectric plate 210 to the bottom surface thereof. The first supply channels 211 are spaced apart from one another, and are provided as paths for supplying a heat transfer medium to the bottom surface of the substrate W.

The lower electrode 220 and the heater 230 are embedded in the dielectric plate 210. The lower electrode 220 is positioned above the heater 230. The lower electrode 220 is electrically connected to a first lower power source 221. The first lower power source 221 includes a direct current power source. A switch 222 is disposed between the lower electrode 220 and the first lower power source 221. The lower electrode 220 may be electrically connected to the first lower power source 221 according to an on/off operation of the switch 222. When the switch 222 is turned on, direct current is applied to the lower electrode 220. Electric force acts between the lower electrode 220 and the substrate W according to the direct current applied to the lower electrode 222, and the substrate W is attached to the dielectric plate 210 by the electric force.

The heater 230 is electrically connected to a second lower power source 231. The heater 230 generates heat by resisting electric current applied from the second lower power source 231. The generated heat is transferred to the substrate W through the dielectric plate 210. The substrate W is maintained at a predetermined temperature by the heat generated from the heater 230. The heater 230 includes a spiral coil. The heater 230 may be embedded with a constant interval in the dielectric plate 210.

The support plate 240 is positioned under the dielectric plate 210. The bottom surface of the dielectric plate 210 and the top surface of the support plate 240 may be adhered to each other by an adhesive 236. The support plate 240 may be formed of an aluminum material. The top surface of the support plate 240 may have a stepped shape with a center region higher than an edge region. The top center region of the support plate 240 has an area corresponding to that of the bottom surface of the dielectric plate 210, and is adhered thereto. A first circulation channel 241, a second circulation channel 242, and a second supply channel 243 are formed in the support plate 240.

The first circulation channel 241 is provided as a path for circulating the heat transfer medium. The first circulation channel 241 may be formed in a spiral shape in the support plate 240. Alternatively, the first circulation channel 241 may be provided in plurality as ring-shaped channels having concentric circles with different radii. In this case, the first circulation channels 241 may communicate with one another. The first circulation channels 241 are formed at the same height.

The second circulation channel 242 is provided as a path for circulating a cooling fluid. The second circulation channel 242 may be formed in a spiral shape in the support plate 240. Alternatively, the second circulation channel 242 may be provided in plurality as ring-shaped channels having concentric circles with different radii. In this case, the second circulation channels 242 may communicate with one another. The second circulation channel 242 may have a cross-sectional area greater than that of the first circulation channel 241. The second circulation channels 242 are formed at the same height. The second circulation channel 242 may be positioned under the first circulation channel 241.

The second supply channel 243 extends upward from the first circulation channel 241, and arrives at the top surface of the support plate 240. The number of second supply channels 243 corresponds to the number of the first supply channels 211. The second supply channels 243 connect the first circulation channel 241 to the first supply channels 211.

The first circulation channel 241 is connected to a heat transfer medium storage part 252 through a heat transfer medium supply line 251. The heat transfer medium storage part 252 stores the heat transfer medium. The heat transfer medium includes inert gas. According to an embodiment of the present invention, the heat transfer medium includes helium (He) gas. The He gas is supplied to the first circulation channel 241 through the heat transfer medium supply line 251, and is supplied to the bottom surface of the substrate W by sequentially passing through the second supply channels 243 and the first supply channels 211. The He gas functions as a medium for transferring the heat transferred from the plasma to the substrate W to the electrostatic chuck 200. Ion particles contained in the plasma are attracted by electric force formed at the electrostatic chuck 200, and are moved to the electrostatic chuck 200. At this point, the ion particles collide with the substrate W to perform an etching process. While the ion particles collide with the substrate W, heat is generated in the substrate W. The heat generated in the substrate W is transferred to the electrostatic chuck 200 through the He gas supplied to a space between the bottom surface of the substrate W and the top surface of the dielectric plate 210. Accordingly, the substrate W can be maintained at a set temperature.

The second circulation channel 242 is connected to a cooling fluid storage part 262 through a cooling fluid supply line 261. The cooling fluid storage part 262 stores the cooling fluid. A cooler 263 may be provided in the cooling fluid storage part 262. The cooler 263 cools the cooling fluid to a predetermined temperature. Alternatively, the cooler 263 may be installed on the cooling fluid supply line 261. The cooling fluid supplied to the second circulation channel 242 through the cooling fluid supply line 261 circulates along the second circulation channel 242 and cools the support plate 240. The cooling of the support plate 240 maintains the substrate W at a predetermined temperature by cooling the dielectric plate 210 and the substrate W together.

The insulation plate 270 is provided under the support plate 240. The insulation plate 270 is provided in a size corresponding to that of the support plate 240. The insulation plate 270 is positioned between the support plate 240 and a bottom surface of the process chamber 100. The insulation plate 270 is formed of an insulation material, and electrically insulates the support plate 240 and the process chamber 100 from each other.

A focus ring 280 is disposed at an edge region of the electrostatic chuck 200. The focus ring 280 has a ring shape, and is disposed around the dielectric plate 210. The top surface of the focus ring 280 may have a stepped shape with an outside portion 280a higher than an inside portion 280b. The inside portion 280b of the focus ring 280 is positioned at the same height as that of the top surface of the dielectric plate 210. The inside portion 280b of the focus ring 280 supports the edge region of the substrate W positioned outside the dielectric plate 210. The outside portion 280a of the focus ring 280 surrounds the edge region of the substrate W. The focus ring 280 expands an electric field formation region such that the substrate W is positioned at a center of a region in which the plasma is formed. Accordingly, the plasma is uniformly formed over the entire region of the substrate W, and thus, the entire region of the substrate W can be uniformly etched.

The gas supply part 300 supplies a process gas into the process chamber 100. The gas supply part 300 includes a gas supply nozzle 310, a gas supply line 320, and a gas storage part 330. The gas supply nozzle 310 is disposed in the central portion of the sealing cover 120. An injection hole is formed in the bottom of the gas supply nozzle 310. The injection hole is disposed under the sealing cover 120, and supplies the process gas into the process chamber 100. The gas supply line 320 connects the gas supply nozzle 310 and the gas storage part 330 to each other. The gas supply line 320 supplies the process gas from the gas storage part 330 to the gas supply nozzle 310. A valve 321 is installed on the gas supply line 320. The valve 321 opens and closes the gas supply line 320, and controls the flow rate of the process gas supplied through the gas supply line 320.

The plasma generation part 400 supplies high frequency power into the process chamber 100 to excite the process gas therein. The plasma generation part 400 includes a housing 410, an upper power source 420, and an antenna unit 430.

The housing 410 has an open bottom, and includes an inner space. The housing 410 is disposed above the sealing cover 120, and is placed on the top surface thereof. The antenna unit 430 is disposed in the inner space of the housing 410. The upper power source 420 generates high frequency current. The generated high frequency current is applied to the antenna unit 430. The antenna unit 430 supplies high frequency power into the process chamber 100.

Figure 2:
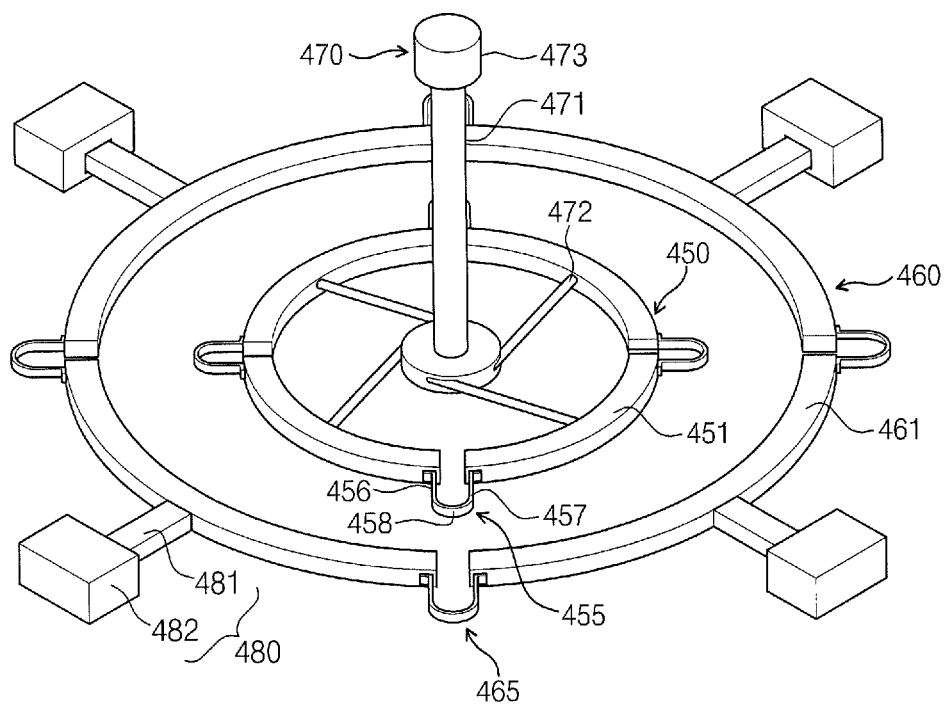
FIG. 2 is a perspective view illustrating an antenna unit of FIG. 1.

FIG. 2 is a perspective view illustrating an antenna unit of FIG. 1.

Referring to FIGS. 1 and 2, the antenna unit 430 includes a plurality of antennas 450 and 460, and a plurality of driving parts 470 and 480.

The antennas 450 and 460 are electrically connected to the upper power source 420. The antennas 450 and 460 supply high frequency power generated from the upper power source 420, into the process chamber 100. The antennas 450 and 460 include a first antenna (also denoted by 450) and a second antenna (also denoted by 460). The first and second antennas 450 and 460 are individually connected to the upper power source 420.

The first antenna 450 is substantially disposed above the central portion of the sealing cover 120. The first antenna 450 includes a plurality of first antenna frames 451 and a plurality of first connecting members 455.

The first antenna frame 451 is provided in the form of an arc shaped plate. The first antenna frames 451 are formed of a conductive material. The first antenna frames 451 are spaced apart from one another. The first antenna frames 451 are arrayed to form a ring shape. Substantially, the first antenna frames 451 are arrayed to form a circular ring shape. Hereinafter, an entire shape of the first antenna 450, defined by the first antenna frames 451, is referred to as a first ring shape. The number of the first antenna frames 451 may be four.

The first connecting members 455 connect neighboring ones of the first antenna frames 451. The first connecting members 455 are formed of a conductive material, and electrically connect neighboring ones of the first antenna frames 451. The first connecting member 455 includes a first frame 456, a second frame 457, and a third frame 458. The first frame 456 is connected to one of two neighboring ones of the first antenna frames 451. The second frame 457 is connected to the other one. The first and second frames 456 and 457 have thin tetragonal plate shapes, and are spaced apart from each other. The third frame 458 has a thin arc plate shape. An end of the third frame 458 extends from an end of the first frame 456, and the other end thereof extends from an end of the second frame 457. The first to third frames 456, 457, and 458 are formed of an elastic material. The first connecting member 455 is stretched or contracted according to movement of the first antenna frames 451. When the first antenna frames 451 move away from the center of the first antenna 450, the first and second frames 456 and 457 move away from each other. On the contrary, when the first antenna frames 451 move close to the center of the first antenna 450, the first and second frames 456 and 457 move close to each other.

The second antenna 460 is disposed outside the first antenna 450, and surrounds the first antenna 450. The second antenna 460 is spaced a predetermined distance from the first antenna 450. The second antenna 460 includes a plurality of second antenna frames 461 and a plurality of second connecting members 465.

The second antenna frame 461 is provided in the form of an arc shaped plate. The arc shape of the second antenna frame 461 is greater than that of the first antenna frame 451. The second antenna frames 461 are spaced apart from one another. The second antenna frames 461 are arrayed to form a circular ring shape. Hereinafter, an entire shape of the second antenna 460, defined by the second antenna frames 461, is referred to as a second ring shape. The number of the second antenna frames 461 may be four.

The second connecting members 465 connect neighboring ones of the second antenna frames 461. The second connecting members 465 have the same structure as that of the first connecting members 455. The second antenna frames 461 and the second connecting members 465 are formed of a conductive material, and are electrically connected to one another.

The driving parts 470 and 480 vary the size of the first and second antennas 450 and 460. Particularly, the driving part 470 varies the size of the first antenna 450, and the driving parts 480 vary the size of the second antenna 460. The driving parts 470 and 480 include a first driving part (also denoted by 470) and a plurality of second driving parts (also denoted by 480).

The first driving part 470 varies the size of the first antenna 450. The first driving part 470 includes a first driving rod 471, a plurality of connecting rods 472, and a first driver 473.

The first driving rod 471 is provided in a cylindrical rod form, and is disposed at the center of the first antenna 450. The first driving rod 471 has a longitudinal direction that is parallel to a vertical direction thereof.

The connecting rod 472 is provided in a thin plate form, and connects the first driving rod 471 to the first antenna frame 451. The number of the connecting rods 472 corresponds to the number of the first antenna frames 451. The connecting rods 472 individually connect the first antenna frames 451 to the first driving rod 471. An end of the connecting rod 472 is connected to the inner surface of the first antenna frame 451, and the other end thereof is connected to the outer circumferential surface of the first driving rod 471.

The first driver 473 rotates the first driving rod 471 through a predetermined angle about an axis parallel to the longitudinal direction of the first driving rod 471. Accordingly, the size of the first antenna 450 is varied. For example, when the first driving rod 471 is rotated clockwise, the connecting rods 472 are wound around the first driving rod 471, and the first antenna frames 451 are moved along the radial direction of the first ring shape toward the center of the first antenna 450. Accordingly, the size of the first antenna 450 is decreased. On the contrary, when the first driving rod 471 is rotated counterclockwise, the connecting rods 472 are unwound, and the first antenna frames 451 are moved away from the center of the first antenna 450 along the radial direction of the first ring shape. Accordingly, the size of the first antenna 450 is increased. As described above, the size of the first antenna 450 is varied according to driving of the first driver 473.

The second driving parts 480 vary the size of the second antenna 460. The second driving part 480 includes a second driving rod 481 and a second driver 482.

The second driving rod 481 is disposed outside the second antenna 460, and connects the second antenna frame 461 to the second driver 482. The second driving rod 481 has a longitudinal direction that is parallel to the radial direction of the second ring shape. An end of the second driving rod 481 is connected to the second antenna frame 461, and the other end thereof is connected to the second driver 482. The number of the second driving rods 481 corresponds to the number of the second antenna frames 461. The second driving rods 481 connect the second antenna frames 461 to the second drivers 482, respectively.

The number of the second drivers 482 corresponds to the number of the second driving rods 481. The second drivers 482 are connected to the second driving rods 481, respectively. The second driver 482 linearly moves the second driving rod 481 along the radial direction of the second ring shape. The second drivers 482 may simultaneously move the second driving rods 481. When the second drivers 482 simultaneously move the second driving rods 481 to move the second antenna frames 461 toward the center of the second antenna 460, the size of the second antenna 460 is decreased. On the contrary, when the second drivers 482 simultaneously move the second driving rods 481 to move the second antenna frames 461 away from the center of the second antenna 460, the size of the second antenna 460 is increased. The second drivers 482 may be individually driven so as to selectively move the second driving rods 481. For example, when a portion of the second drivers 482 are operated, a portion of the second antenna frames 461 are moved, and the rest thereof are not moved. Accordingly, the ring shape of the second antenna 460 is modified, and the size thereof is changed.

Hereinafter, a substrate treating method using a substrate treating apparatus as described above will now be described.

When the substrate W is placed on the electrostatic chuck 200, direct current is applied to the lower electrode 220 from the first lower power source 221. Electric force acts between the lower electrode 220 and the substrate W according to the direct current applied to the lower electrode 220, and the substrate W is attached to the dielectric plate 210 by the electric force.

Then, the process gas is supplied into the process chamber 100 through the gas supply nozzle 310. High frequency power generated from the upper power source 420 is supplied into the process chamber 100 through the first and second antennas 450 and 460. The supplied high frequency power excites the process gas staying within the process chamber 100. The excited process gas is provided to the substrate W to treat the substrate W. The excited process gas may perform an etching process.

When the high frequency power is supplied into the process chamber 100, the size of the first and second antennas 450 and 460 may be varied.

FIGS. 3 to 9 are plan views illustrating cases that the size of antennas varied according to an embodiment of the present invention.

Figure 3:
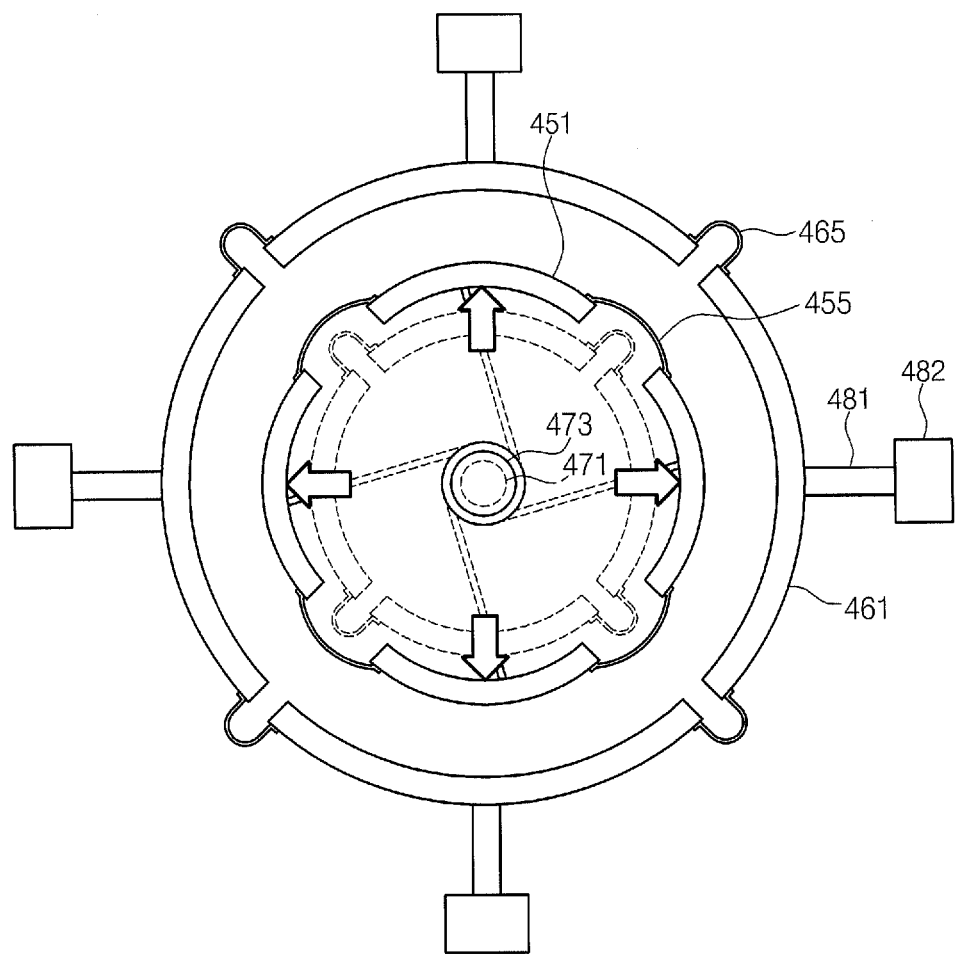
FIGS. 3 to 9 are plan views illustrating cases that the size of antennas varied according to another embodiment of the present invention.

Referring to FIG. 3, the first driver 473 rotates the first driving rod 471 in a certain direction. Accordingly, the first antenna frames 451 are moved away from the center of the first antenna 450 along the radial direction thereof. At this point, the second antenna frames 461 are not moved. Thus, the size of the first antenna 450 is increased, and the size of the second antenna 460 is not changed.

Figure 4:
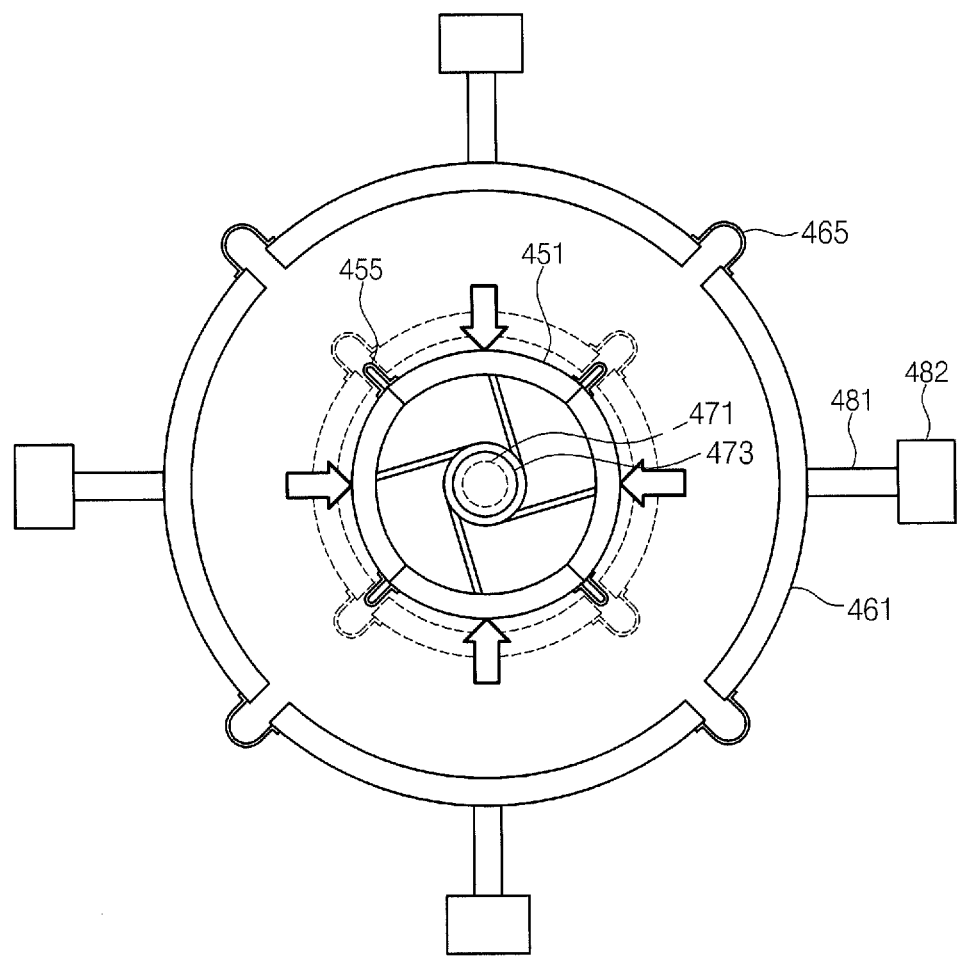

Referring to FIG. 4, the first driver 473 rotates the first driving rod 471 in a direction opposite to that of FIG. 3. Accordingly, the first antenna frames 451 are moved close to the center of the first antenna 450 along the radial direction thereof. At this point, the second antenna frames 461 are not moved. Thus, the size of the first antenna 450 is decreased, and the size of the second antenna 460 is not changed.

Figure 5:
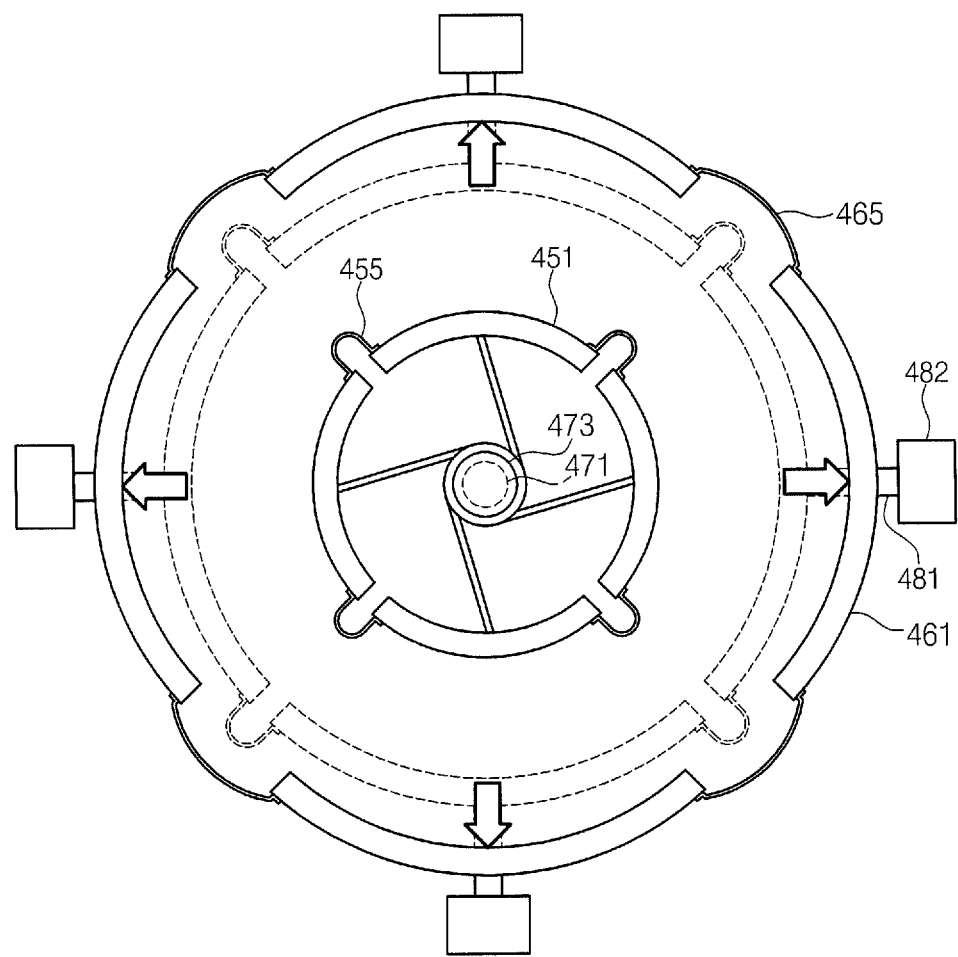

Referring to FIG. 5, the second drivers 482 simultaneously move the second driving rods 481. Particularly, the second drivers 482 move the second driving rods 481 such that the second antenna frames 461 move away from the center of the second antenna 460. At this point, the first antenna frames 451 are not moved. Thus, the size of the first antenna 450 is not changed, and the size of the second antenna 460 is increased.

Figure 6:
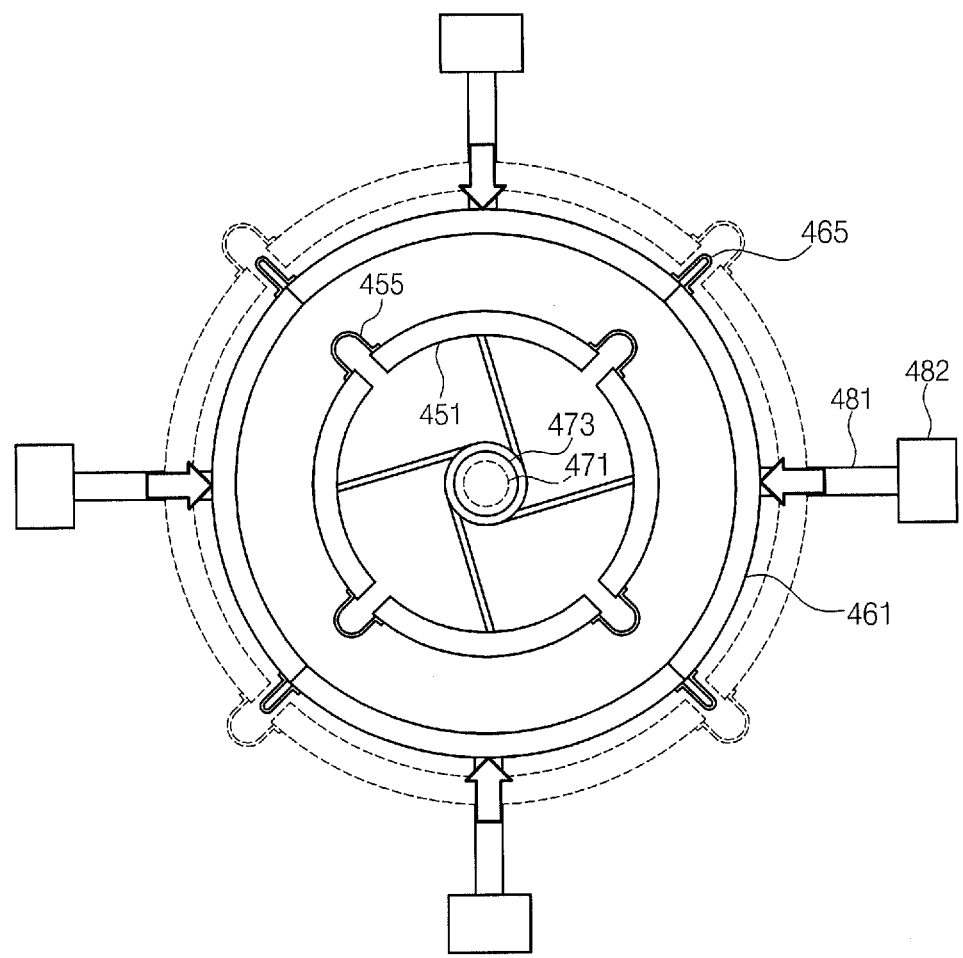

Referring to FIG. 6, the second drivers 482 simultaneously move the second driving rods 481 such that the second antenna frames 461 move toward the center of the second antenna 460. At this point, the first antenna frames 451 are not moved. Thus, the size of the first antenna 450 is not changed, and the size of the second antenna 460 is decreased.

Figure 7:
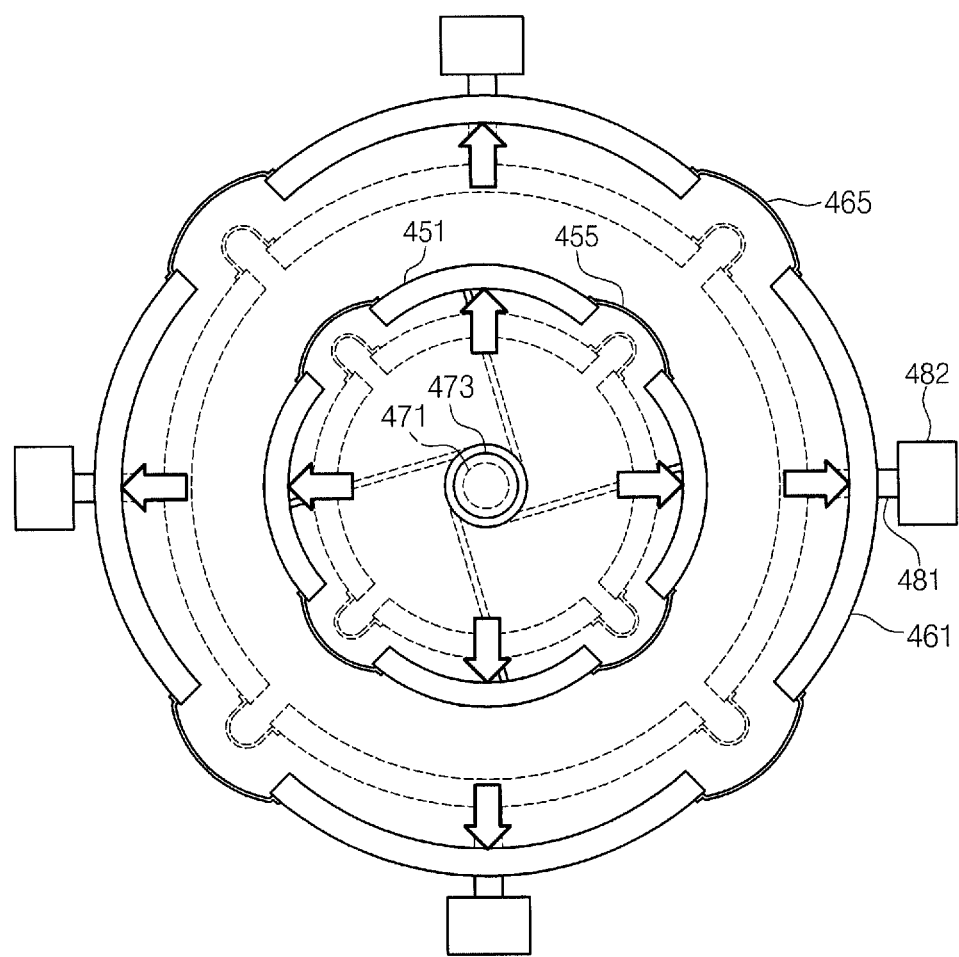

Referring to FIG. 7, the first driver 473 rotates the first driving rod 471 in a certain direction to move the first antenna frames 451 away from the center of the first antenna 450. The second drivers 482 move the second driving rods 481 such that the second antenna frames 461 move away from the center of the second antenna 460. Accordingly, the size of the first and second antennas 450 and 460 is increased. The movement of the first antenna frames 451 may be followed by the movement of the second antenna frames 461. Alternatively, the movement of the first antenna frames 451 and the movement of the second antenna frames 461 may simultaneously happen.

Figure 8:
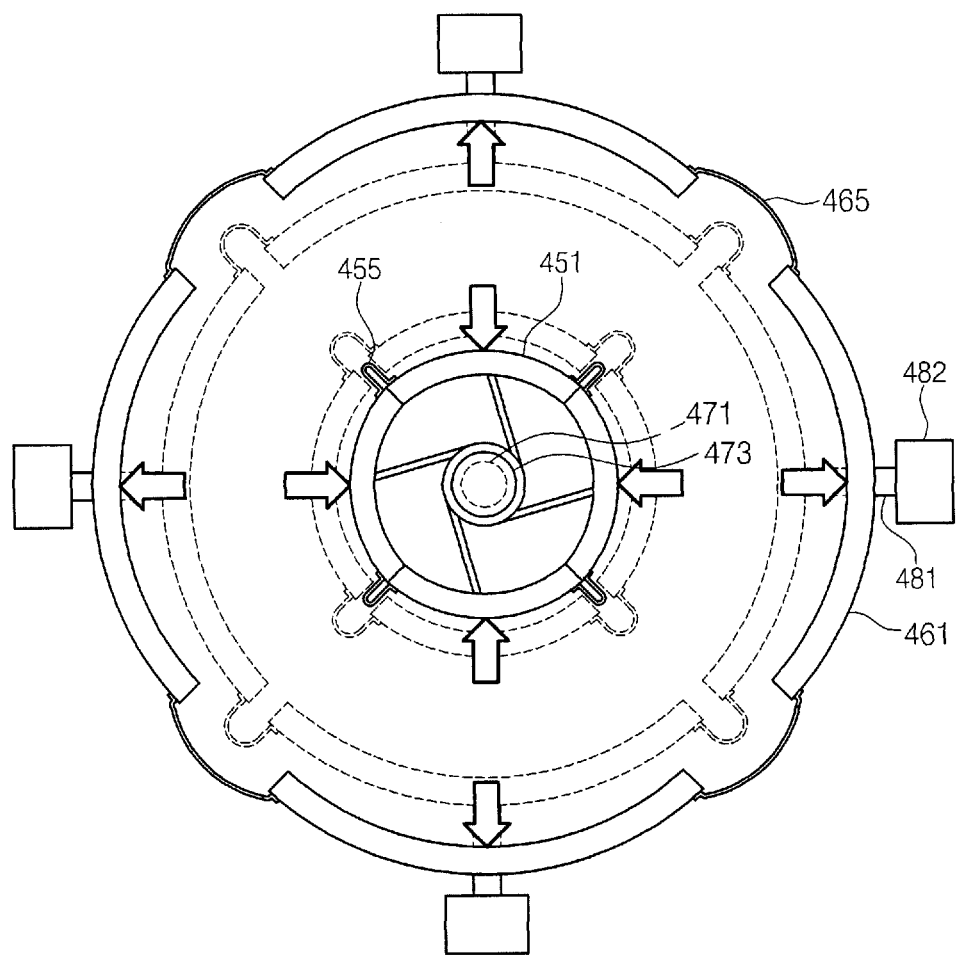

Referring to FIG. 8, the first driver 473 rotates the first driving rod 471 in a direction opposite to that of FIG. 7 to move the first antenna frames 451 toward the center of the first antenna 450. In addition, the second drivers 482 move the second driving rods 481 such that the second antenna frames 461 move away from the center of the second antenna 460. Thus, the size of the first antenna 450 is decreased, and the size of the second antenna 460 is increased. The movement of the first antenna frames 451 may be followed by the movement of the second antenna frames 461. Alternatively, the movement of the first antenna frames 451 and the movement of the second antenna frames 461 may simultaneously happen.

Figure 9:
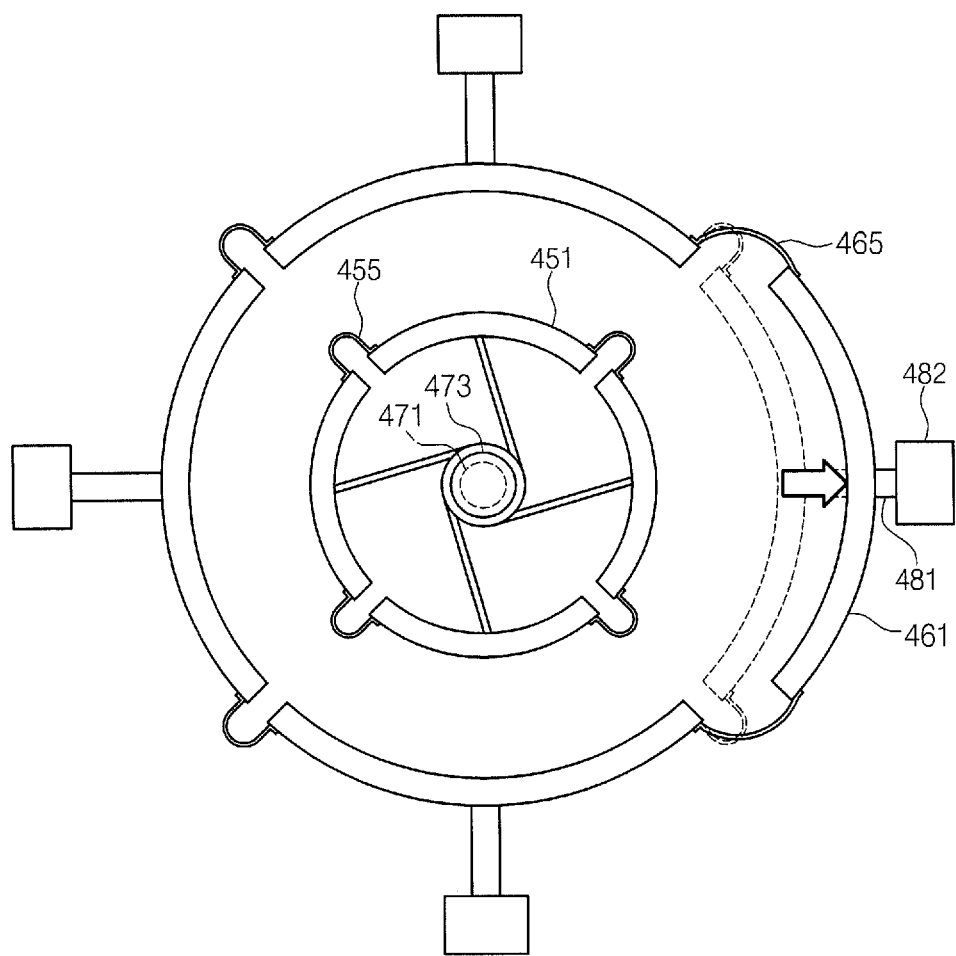

Referring to FIG. 9, the first antenna 450 is not moved. When one of the second antenna frames 461 is connected to one of the second drivers 482, and is denoted by 461a, the corresponding second driver 482 may move the second antenna frame 461a away from the center of the second antenna 460 or toward the center of the second antenna 460. At this point, the rest of the second antenna frames 461, which are denoted by 461b to 461d, are not moved. Thus, the ring shape of the second antenna 460 is modified. In addition, the size of the second antenna 460 is decreased or increased. Although the second antenna frame 461a is moved, two or three of the second antenna frames 461 may be moved.

When an antenna is symmetrical, the density of plasma is theoretically uniform along the radial direction of the antenna. However, the density of plasma is practically uneven due to various causes, and thus, a process treatment map is also uneven in regions on a substrate. According to the current embodiment, a density distribution of plasma generated in inner regions of the process chamber 100 can be controlled by varying the size and shape of the first and second antennas 450 and 460. Since the density of plasma is proportional to the intensity of energy applied to a process gas, the size and shape of the first and second antennas 450 and 460 are controlled to apply a high intensity of energy to a region where a density of plasma is low, so that the plasma can have a uniform density distribution. A density distribution of plasma may be analyzed from a map of a treated substrate.

Although the size of the first antenna 450 is varied according to rotation of the first driving rod 471, the size of the first antenna 450 may be varied according to vertical movement of the first driving rod 471.

In addition, although the second antenna frames 461 moves at the same level, the second antenna frames 461 may move individually and vertically. In addition, although the second driving part 480 moves the second antenna frame 461 toward the center of the second antenna 460 or away therefrom, the second driving part 480 may vertically move the second antenna frame 461 to vary the size of the second antenna 460. The vertical movement of the second antenna frame 461 adjusts the distance between the second antenna frame 461 and the process chamber 100. Accordingly, a density distribution of plasma within the process chamber 100 is adjusted.

Figure 10:
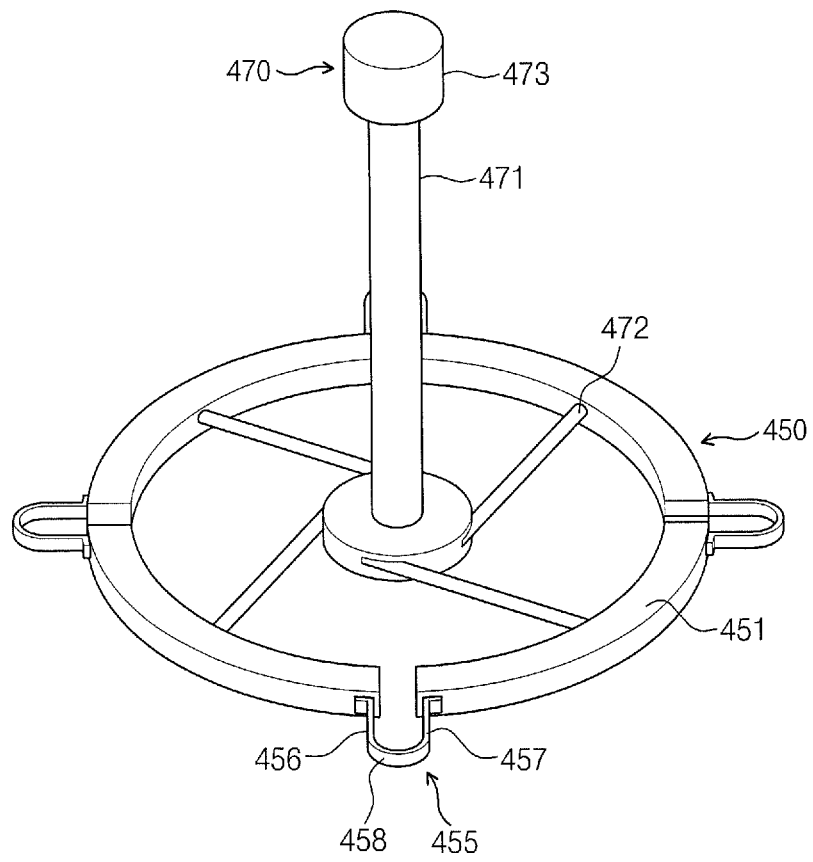
FIG. 10 is a perspective view illustrating an antenna unit according to another embodiment of the present invention.

FIG. 10 is a perspective view illustrating an antenna unit according to an embodiment of the present invention. Referring to FIG. 10, an antenna unit according to the current embodiment includes an antenna 450 and a driving part 470.

The antenna 450 and the driving part 470 have the same structure as that of the first antenna 450 and the first driving part 470 of FIG. 2. The antenna 450 includes a plurality of connecting members 455 and a plurality of antenna frames 451 electrically connected to one another through the connecting members 455. A driving rod 471 is connected to the antenna frames 451 through connecting rods 472. A driver 473 rotates the driving rod 471 to simultaneously move the antenna frames 451 along the radial direction of the antenna 450. The size of the antenna 450 is increased of decreased according to the direction of rotation of the driving rod 471.

Figure 11:
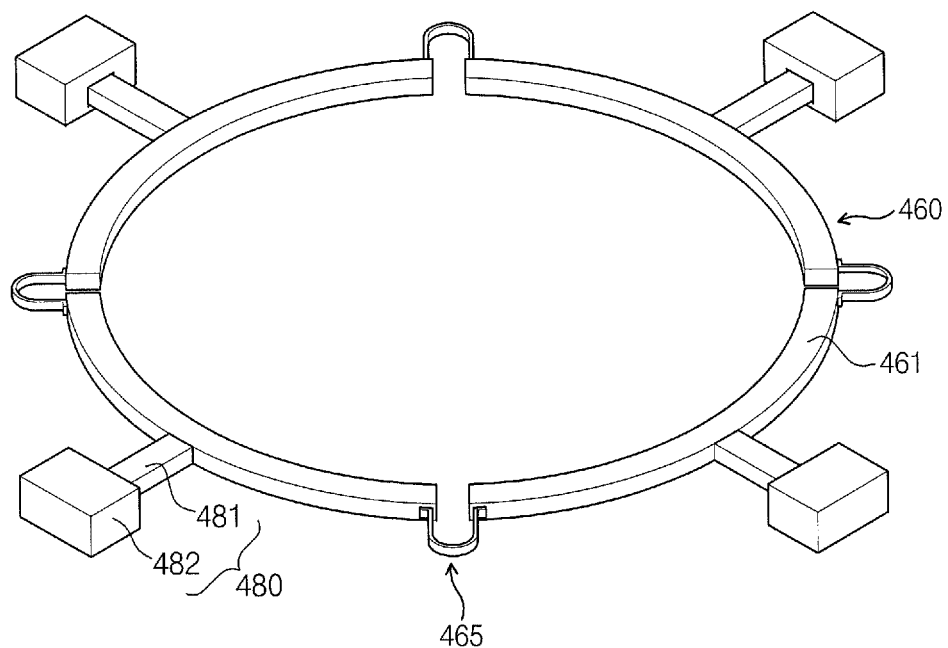
FIG. 11 is a perspective view illustrating an antenna unit according to another embodiment of the present invention.

FIG. 11 is a perspective view illustrating an antenna unit according to an embodiment of the present invention.

Referring to FIG. 11, an antenna unit according to the current embodiment includes an antenna 460 and a plurality of driving parts 480.

The antenna 460 and the driving parts 480 have the same structure as that of the second antenna 460 and the second driving parts 480 of FIG. 2. The antenna 460 includes a plurality of connecting members 465 and a plurality of antenna frames 461 electrically connected to one another through the connecting members 465. The number of driving rods 481 corresponds to the number of the antenna frames 461. The driving rods 481 are connected to the antenna frames 461, and are in one-to-one correspondence thereto.

Drivers 482 are connected to the driving rods 481, respectively, and move the antenna frames 461 along the radial direction of the antenna 460. The drivers 482 may simultaneously move the antenna frames 461. Furthermore, the drivers 482 may selectively move the antenna frames 461. The shape and size of the antenna 460 are varied according to an operation of the drivers 482.

Although an etching process using plasma is exemplified in the above embodiments, a substrate treating process is not limited thereto, and thus, various substrate treating processes using plasma, such as an ashing process, a depositing process, and a cleaning process, may be exemplified.

According to the embodiments, since a density distribution of plasma is uniform, a substrate treating process is uniformly performed.

In addition, a density distribution of plasma can be adjusted.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
a process chamber having an inner space;
a substrate support part disposed within the process chamber for supporting a substrate;
a gas supply part supplying a process gas into the process chamber;
an antenna unit comprising a first antenna and a second antenna that is spaced apart from and surrounding the first antenna, wherein each antenna comprises an electrically conductive ring of material having a continuous circumferential surface that is symmetrically disposed about a center axis, and wherein each antenna is configured to supply high frequency power into the process chamber to excite the process gas within the process chamber; and a plurality of driving parts connected to each of the first and second antennas for moving the respective first and second antennas, wherein the first and second antennas are each individually movable in a radial direction for increasing or decreasing a radius of the respective first and second antennas.

2. The substrate treating apparatus of claim 1, wherein the first and second antenna each comprise:

a plurality of antenna frames spaced apart from one another; and a plurality of connecting members connecting adjacent antenna frames to each other, and the plurality of driving parts being connected to the antenna frames for individually moving the antenna frames.

3. The substrate treating apparatus of claim 2, wherein the antenna frames are arrayed to form a ring shape, and the driving parts move the antenna frames along a radial direction of the ring shape, respectively.

4. The substrate treating apparatus of claim 3, wherein each of the antenna frames has an arc shape.

5. The substrate treating apparatus of claim 2, wherein the connecting members are stretched or contracted according to movement of the antenna frames.

6. The substrate treating apparatus of claim 5, wherein each of the connecting members comprises:

a first frame connected to one of the antenna frames;

a second frame connected to another antenna frame adjacent to the antenna frame connected to the first frame; and a third frame connecting the first frame and the second frame to each other, and having an arc shape.

7. The substrate treating apparatus of claim 1, wherein at least some of the plurality of driving parts are configured to rotate about a center axis of the first antenna.

8. The substrate treating apparatus of claim 1, wherein the first antenna comprises:

a plurality of first antenna frames arrayed to form a first ring shape; and a plurality of first connecting members connecting adjacent first antenna frames to each other; and wherein the second antenna comprises:

a plurality of second antenna frames arrayed to form a second ring shape having a radius greater than that of the first ring shape; and a plurality of second connecting members connecting adjacent second antenna frames to each other, and wherein the driving parts comprise:

a first driving part moving the first antenna frames along a radial direction of the first ring shape; and a plurality of second driving parts individually moving the second antenna frames along a radial direction of the second ring shape.

9. The substrate treating apparatus of claim 8, wherein the first driving part comprises:

a first driving rod disposed at a center of the first antenna, and vertically extending;

a plurality of first connecting rods individually connecting the first antenna frames to the first driving rod; and a first driver rotating the first driving rod through a predetermined angle about an axis parallel to a longitudinal direction of the first driving rod.

10. The substrate treating apparatus of claim 8, wherein the second driving parts comprise:

a plurality of second driving rods connected to the second antenna frames, respectively, and having a longitudinal direction that is the radial direction of the second ring shape; and a plurality of second drivers connected to the second driving rods, respectively, and moving the second driving rods along the radial direction of the second ring shape.

11. The substrate treating apparatus of claim 1, wherein the antenna unit comprises:

a plurality of antenna frames spaced apart from one another to form a ring shape; and a plurality of connecting members connecting the antenna frames, and the plurality of driving parts simultaneously moving the antenna frames.

12. The substrate treating apparatus of claim 11, wherein the plurality of driving parts comprise:

a driving rod vertically extending at a center of the ring shape;

a plurality of connecting rods individually connecting the antenna frames to the driving rod; and a driver rotating the driving rod about an axis parallel to a longitudinal direction of the driving rod.

13. An antenna unit for applying high frequency power to a process gas to excite the process gas, wherein the antenna unit comprises:

a first antenna configured to apply high frequency power, wherein the first antenna comprises a first radius;

a second antenna configured to apply high frequency power, wherein the second antenna is coaxial with the first antenna, and comprises a second radius that is larger than the first radius; and a plurality of driving parts connected to the first and second antennas for moving the respective first and second antennas, wherein the first and second antennas each comprise an electrically conductive rind of material having a continuous circumferential surface that is symmetrically disposed about a center axis, and wherein each antenna is individually movable in a radial direction for increasing or decreasing a respective radius of the first and second antennas.

14. The antenna unit of claim 13, wherein the first and second antennas each comprise:

a plurality of antenna frames spaced apart from one another to form a ring shape; and a plurality of connecting members connecting adjacent antenna frames to each other, and the plurality of driving parts being configured to individually move the antenna frames along a radial direction of the ring shape.

15. The antenna unit of claim 14, wherein at least some of the plurality of driving parts comprise:

a plurality of driving rods extending along the radial direction of the ring shape, and connected to the antenna frames, respectively; and a plurality of drivers connected to the driving rods, respectively, and moving the driving rods along the radial direction of the ring shape.

16. The antenna unit of claim 14, wherein the first and second antennas each comprise:

a plurality of antenna frames spaced apart from one another to form a ring shape; and a plurality of connecting members connecting the antenna frames, and at least some of the plurality of driving part being configured to simultaneously move the antenna frames.

17. The antenna unit of claim 14, wherein at least some of the driving parts comprise:
a driving rod vertically extending at a center of the ring shape;
a plurality of connecting rods individually connecting the antenna frames to the driving rod; and
a driver rotating the driving rod about an axis parallel to a longitudinal direction of the driving rod.

18. The antenna unit of claim 13, wherein:
the first antenna comprises first antenna frames arrayed to form a first ring shape;
a plurality of first connecting members connecting adjacent first antenna frames to each other;
the second antenna comprises second antenna frames arrayed to form a second ring shape; and
a plurality of second connecting members connecting adjacent second antenna frames to each other;
wherein the second ring shape is spaced apart from and surrounds the first ring shape.

19. The antenna unit of claim 18, wherein the plurality of driving parts comprises:
a first driving rod vertically extending at the center of the first ring shape;
a plurality of connecting rods individually connecting the first antenna frames to the first driving rod;
a first driver rotating the first driving rod about an axis parallel to a longitudinal direction of the first driving rod;
a plurality of second driving rods extending along a radial direction of the second ring shape, and connected to the second antenna frames, respectively; and
a plurality of second drivers connected to the second driving rods, respectively, and moving the second driving rods along the radial direction of the second ring shape.

* * * * *